United States Patent
Kliemann

(10) Patent No.: US 11,205,026 B2
(45) Date of Patent: Dec. 21, 2021

(54) BENEFIT APPORTIONING SYSTEM AND METHODS FOR VEHICLE PLATOONS

(71) Applicant: Toyota Research Institute, Inc., Los Altos, CA (US)

(72) Inventor: Matthew Kliemann, Ann Arbor, MI (US)

(73) Assignee: Toyota Research Institute, Inc., Los Altos, CA (US)

( * ) Notice: Subject to any disclaimer, the term of this patent is extended or adjusted under 35 U.S.C. 154(b) by 620 days.

(21) Appl. No.: 16/017,171

(22) Filed: Jun. 25, 2018

(65) Prior Publication Data

US 2019/0392091 A1 Dec. 26, 2019

(51) Int. Cl.
| | |
|---|---|
| *G08G 1/00* | (2006.01) |
| *G06F 30/20* | (2020.01) |
| *G05D 1/02* | (2020.01) |
| *G05D 1/00* | (2006.01) |

(52) U.S. Cl.
CPC ............... *G06F 30/20* (2020.01); *G08G 1/22* (2013.01); *G05D 1/0005* (2013.01); *G05D 1/0027* (2013.01); *G05D 1/0217* (2013.01); *G05D 1/0291* (2013.01); *G05D 1/0293* (2013.01); *G05D 2201/0213* (2013.01)

(58) Field of Classification Search
CPC ... G08G 1/22; G01C 21/3415; B60W 30/165; B60W 60/0023; G05D 1/0293; G05D 1/0217; G05D 1/0027; G05D 2201/0213; G05D 1/0005; G05D 1/0291; G06F 30/20
See application file for complete search history.

(56) References Cited

U.S. PATENT DOCUMENTS

| | | | |
|---|---|---|---|
| 8,620,517 B2 | 12/2013 | Caveney et al. | |
| 9,927,816 B2* | 3/2018 | Li | G05D 1/0027 |
| 10,017,179 B2* | 7/2018 | Alden | H04W 84/18 |
| 10,216,195 B2* | 2/2019 | Switkes | G05D 1/0088 |
| 10,254,764 B2* | 4/2019 | Laubinger | B60W 30/165 |
| 10,304,334 B2* | 5/2019 | Okabe | G08G 1/127 |

(Continued)

OTHER PUBLICATIONS

Van De Hoef et al., "Coordinating Truck Platooning by Clustering Pairwise Fuel-Optimal Plans", 2015 IEEE 18th International Conference on Intelligent Transportation Systems, Oct. 22, 2015, 9 pages.

(Continued)

*Primary Examiner* — Kibrom K Gebresilassie
(74) *Attorney, Agent, or Firm* — Christopher G. Darrow; Darrow Mustafa PC

(57) ABSTRACT

The systems and methods described herein disclose vehicle positioning and benefit distribution in a vehicle platoon. As described here, vehicles are organized in the platoon based on maximum benefit to the platoon as a whole. The systems and methods then determine the difference in benefit received between each platoon member and equalize between members. The systems and methods can include determining cumulative travel benefits for a group of vehicles. A platoon organization can then be created to achieve the cumulative travel benefits. A platoon can then be created using the platoon organization. The benefit distribution of the platoon can then be determined. Then, the actualized benefits can be apportioned to the one or more platoon members based on the benefit distribution.

17 Claims, 8 Drawing Sheets

(56) References Cited

U.S. PATENT DOCUMENTS

| | | | |
|---|---|---|---|
| 10,459,455 B2* | 10/2019 | Punithan | G05D 1/0016 |
| 10,514,706 B2* | 12/2019 | Schuh | G05D 1/0257 |
| 2008/0249667 A1 | 10/2008 | Horvitz et al. | |
| 2014/0156177 A1 | 6/2014 | Caskey et al. | |
| 2015/0319093 A1* | 11/2015 | Stolfus | G08G 1/0133 |
| | | | 370/237 |
| 2016/0054735 A1* | 2/2016 | Switkes | H04W 4/44 |
| | | | 701/23 |
| 2017/0329348 A1* | 11/2017 | Li | G05D 1/0212 |
| 2017/0344023 A1* | 11/2017 | Laubinger | B60W 50/14 |
| 2017/0349176 A1* | 12/2017 | Alden | G07C 5/085 |
| 2019/0171227 A1* | 6/2019 | Sujan | B60W 10/06 |
| 2020/0027355 A1* | 1/2020 | Sujan | G05D 1/0295 |

OTHER PUBLICATIONS

Nemeth et al., "Design of platoon velocity based on multi-criteria optimization *", Proceedings of the 7th IFAC Symposium on Robust Control Design, The International Federation of Automatic Control Aalborg, Denmark, Jun. 20-22, 2012, pp. 523-528 (6 pages).

Khaksari et al., "Performance Analysis and Optimization of the Joining Protocol for a Platoon of Vehicles", 2012 5th International Symposium on Communications, Control and Signal Processing, 2012, 6 pages.

Liang et al., "Heavy-Duty Vehicle Platoon Formation for Fuel Efficiency", IEEE Transations on Intelligent Transportation Systems, vol. 17, No. 4, Apr. 2016, pp. 1051-1061 (11 pages).

Dao et al., "A strategy for optimisation of cooperative platoon formation", International Journal of Vehicle Information and Communication Systems, Aug. 2013, 18 pages.

Larson et al., "Coordiated Platoon Routing in a Metropolitan Network", Argonne National Laboratory, May 2016 (revised Oct. 2016) (12 pages).

Peloton, "Safety & Efficiency: Truck Platooning", retrieved from the Internet: <http://peloton-tech.com/>, retrieved Jul. 28, 2021 (8 pages).

* cited by examiner

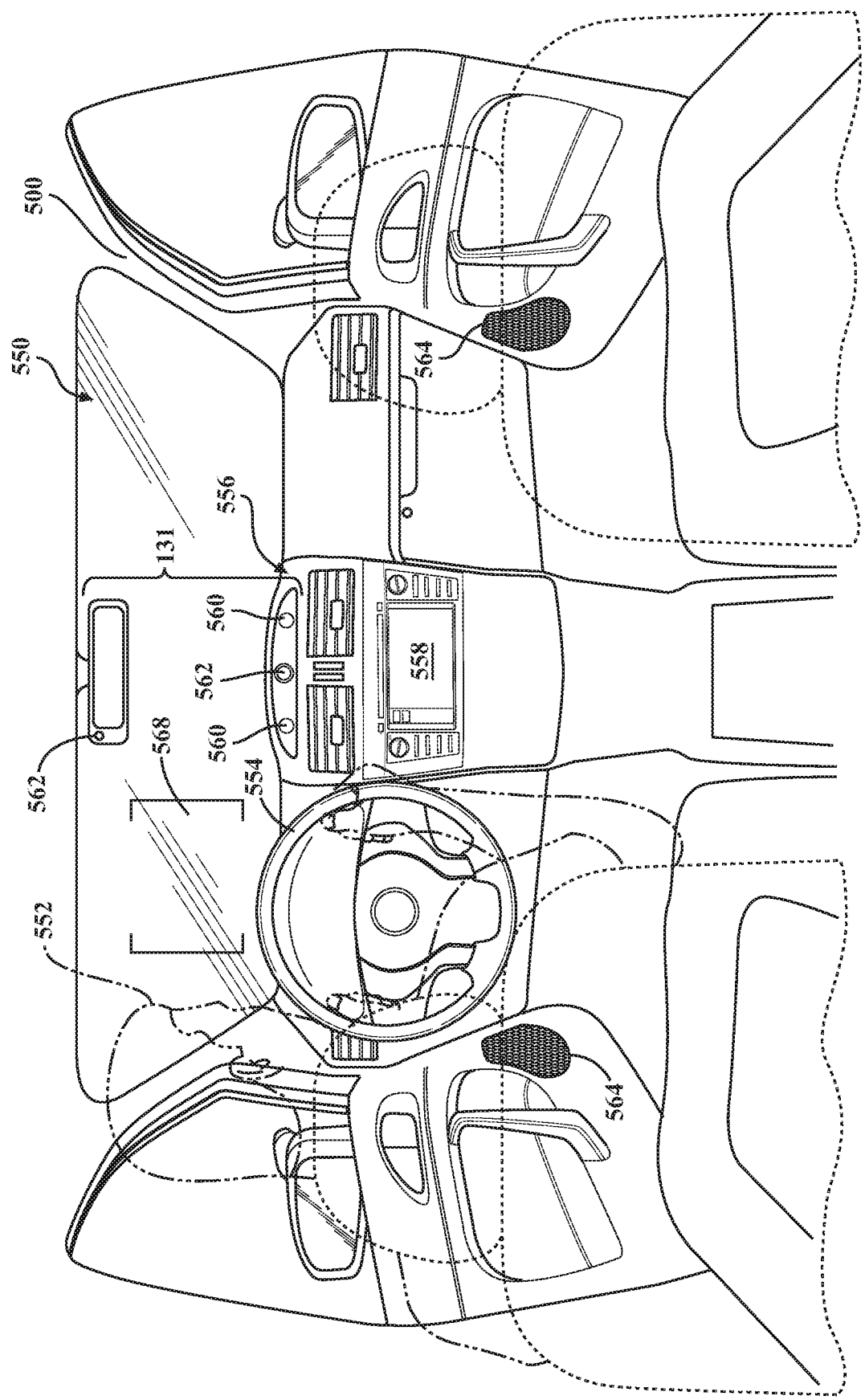

BENEFIT APPORTIONING SYSTEM AND METHODS FOR VEHICLE PLATOONS

TECHNICAL FIELD

Embodiments described herein generally relate to vehicle platooning. More specifically, the embodiments generally relate to systems and methods of benefit distribution in vehicle platooning.

BACKGROUND

Autonomous vehicle platooning relates to multiple vehicles, such as cars and trucks, which move together and in unison while maintaining a minimum safe distance apart. Thus, autonomous vehicle platooning can allow vehicles to follow along similar routes and achieve higher efficiency with regards to speed and fuel consumption. Autonomous vehicle platooning has been contemplated for the transfer of large quantities of goods using multiple vehicles moving in unison, to reduce vehicle stress and increase fuel efficiency. Autonomous vehicle platooning offers the potential to achieve numerous benefits, such as improvement in fuel efficiency due to reduction in air resistance of the vehicle, reduction of the risk of accidents, and improvement to convenience of an operator in each vehicle.

SUMMARY

The systems and methods described herein include autonomous vehicle platooning configurations and apportioning benefits therein. By considering shared aerodynamics, platooned vehicles can achieve greater benefits than current platooning schemes provide. A compensation and/or transfer mechanism allows for sharing the benefits between platooned vehicles. In one embodiment, a platoon apportioning system for vehicle positioning and benefit distribution in a vehicle platoon is disclosed. The platoon apportioning system can include one or more processors and a memory communicably coupled to the one or more processors. The memory can store a benefit determination module including instructions that when executed by the one or more processors cause the one or more processors to determine one or more cumulative travel benefits for a group of vehicles. The memory can further store a platoon formation module including instructions that when executed by the one or more processors cause the one or more processors to define a platoon organization to achieve at least a portion of the one or more cumulative travel benefits. The memory can further store an apportioning module including instructions that when executed by the one or more processors cause the one or more processors to determine a benefit distribution of the cumulative travel benefits for the platoon organization, and to apportion the cumulative travel benefits to the group of vehicles based on the benefit distribution.

In another embodiment, a non-transitory computer-readable medium for vehicle positioning and benefit distribution in a vehicle platoon is disclosed. The non-transitory computer-readable medium can store instructions that when executed by one or more processors cause the one or more processors to determine one or more cumulative travel benefits for a group of vehicles. The non-transitory computer-readable medium can further store instructions to define a platoon organization to achieve at least a portion of the one or more cumulative travel benefits. The non-transitory computer-readable medium can further store instructions to determine a benefit distribution of the cumulative travel benefits for the platoon organization. The non-transitory computer-readable medium can further store instructions to apportion the cumulative travel benefits to the group of vehicles based on the benefit distribution.

In another embodiment, a method for vehicle positioning and benefit distribution in a vehicle platoon is disclosed. The method can include determining one or more cumulative travel benefits for a group of vehicles. The method can further include defining a platoon organization to achieve at least a portion of the one or more cumulative travel benefits. The method can further include determining a benefit distribution of the cumulative travel benefits for the platoon organization. The method can further include apportioning the cumulative travel benefits to the group of vehicles based on the benefit distribution.

Embodiments of the present application can be more clearly understood with relation to the figures and the description below.

BRIEF DESCRIPTION OF THE DRAWINGS

So that the manner in which the above recited features of the present disclosure can be understood in detail, a more particular description of the disclosure, briefly summarized above, may be had by reference to the embodiments, some of which are illustrated in the appended drawings. It is to be noted, however, that the appended drawings illustrate only typical embodiments of this disclosure and are therefore not to be considered limiting of its scope. The disclosure may admit to other equally effective embodiments.

FIGS. 5A, 5B and 5C depicts an operator in a vehicle incorporating the platoon apportioning system, according to embodiments described herein.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Figure 1:
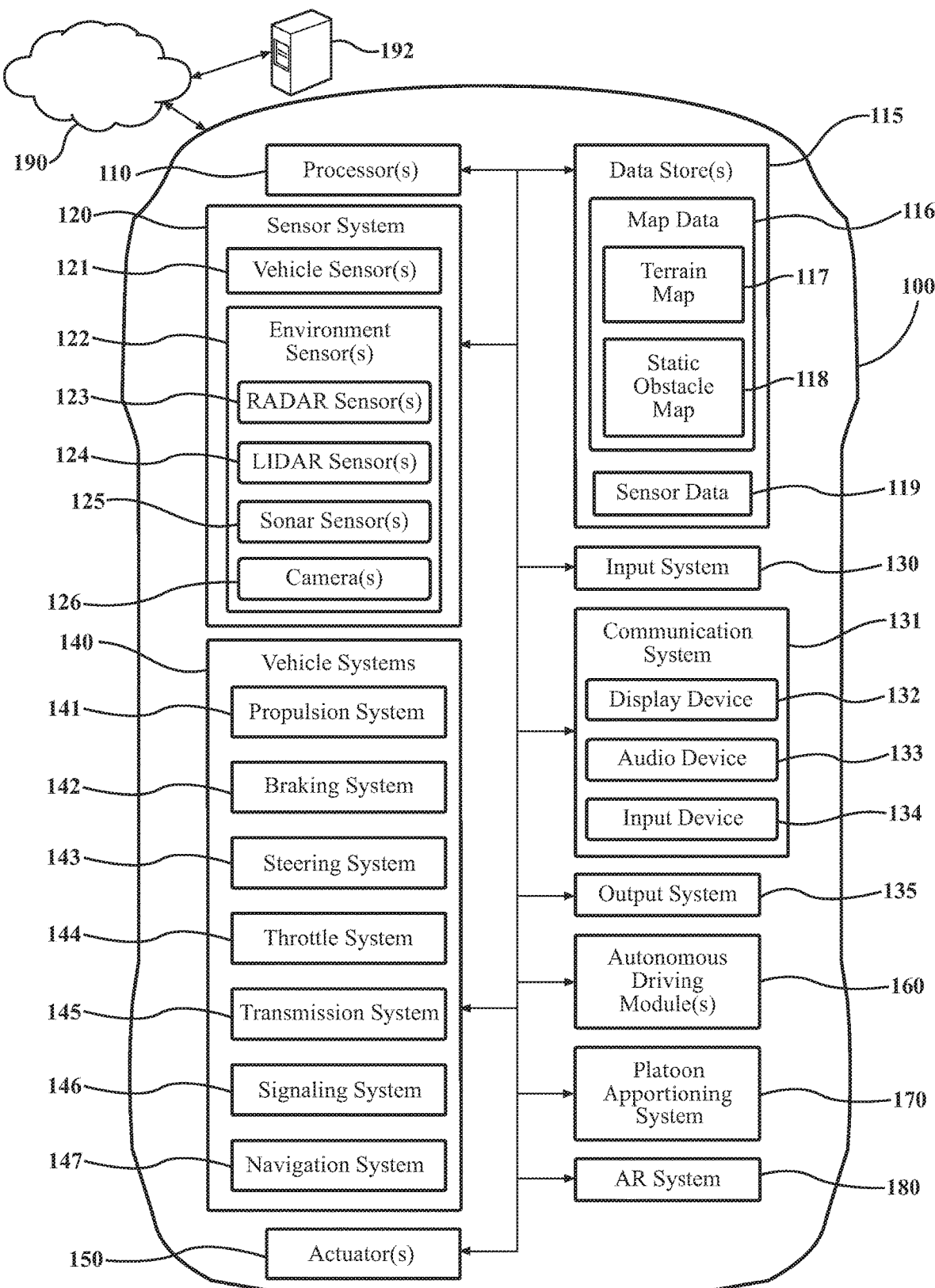
FIG. 1 is a block diagram of a vehicle useable as part of a platoon apportioning system, according to embodiments described herein.

The invention disclosure describes systems and method for enhancing vehicle platooning (the use of technology to convoy vehicles in close proximity) by using simulation. The simulations provide an indication of a variety of parameters regarding the platoon group, such that a platoon-related objective can be achieved, such as fuel savings or provide high safety, and provide a mechanism for equally distributing the benefits of the platoon, such as fuel savings, equally among participating vehicles.

One or more platoon-capable vehicles can report various aspects of their vehicle environment interaction, such as their road position, direction of travel, vehicle characteristics (e.g., coefficient of drag and rear surface area), and intended route/destination to a network-connected server. The network-connected server can further determine one or more of these aspects. As well, the network connected server can pull down roadway information (such as slope, curvature information, and local weather) to factor into a platoon formation plan. The real-world data (such as recorded fuel economy, drag on the vehicle, or other features unique to the vehicle based on age, damage or modification) can be incorporated using real-world data collection, calculations and/or simulations.

The network-connected server can further utilize a physics-based simulation to analyze permutations of the platoon, such as various vehicle ordering and grouping permutations, most efficient distances between the vehicles, and others to find one or more cumulative travel benefits for the platoon. Cumulative travel benefits can include the maximal fuel savings, safest ordering in case of a collision, or some combination thereof. Cumulative travel benefits can be weighed against platooning restrictions, such as destination and vehicle characteristic constraints (i.e., maximum deceleration rate) to create the platoon formation plan. The network can then upload or present the platoon formation plan to the vehicle computers via the network. The platoon-capable vehicles can then utilize said plan in order to achieve the desired grouping, execute lane changes, and for platoon-level acceleration/deceleration as desired.

Further, the systems and methods described herein can ensure the benefits are appropriately distributed between parties participating in the platoon. The vehicles within the platoon will likely have different aerodynamic profiles which create different fuel economy savings due to air resistance and turbulence, different acceptance of risk, different vehicle wear, and others. Thus, in seeking to maximize benefits within the platoon, the distribution of said benefits will not be equal among vehicles participating in the platoon.

Therefore, the system can quantify the difference in benefit either during or after the platooning is complete. Using a variety of different parameters, such as vehicle weight, EPA estimated fuel economy, vehicle wear, or others, the systems and methods can then apportion the total benefit among the vehicles. This benefit can then be distributed as charging or fuel credits, as actual or virtual currency, or through other compensation schemes provided by the platooning service network or by the platoon-capable vehicles. In this way, the systems and methods described herein can compensate vehicles that may be taking a loss such as lead vehicle for the benefit of the group. Embodiments of the present application can be more clearly understood with relation to the figures and the description below.

Referring to FIG. 1, an example of a vehicle 100 is illustrated. As used herein, a "vehicle" is any form of motorized transport. In one or more implementations, the vehicle 100 is an automobile. While arrangements will be described herein with respect to automobiles, it will be understood that embodiments are not limited to automobiles. In some implementations, the vehicle 100 may be any other form of motorized transport that, for example, can operate autonomously, semi-autonomously, or manually by an in-vehicle operator. The vehicle 100 can include a platoon apportioning system 170 or capabilities to support the platoon apportioning system 170, and thus benefits from the functionality discussed herein.

The vehicle 100 also includes various elements. It will be understood that in various embodiments it may not be necessary for the vehicle 100 to have all of the elements shown in FIG. 1. The vehicle 100 can have any combination of the various elements shown in FIG. 1. Further, the vehicle 100 can have additional elements to those shown in FIG. 1. In some arrangements, the vehicle 100 may be implemented without one or more of the elements shown in FIG. 1. While the various elements are shown as being located within the vehicle 100 in FIG. 1, it will be understood that one or more of these elements can be located external to the vehicle 100. Further, the elements shown may be physically separated by large distances.

Some of the possible elements of the vehicle 100 are shown in FIG. 1 and will be described along with subsequent figures. However, a description of many of the elements in FIG. 1 will be provided after the discussion of FIGS. 2-6 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a more thorough understanding of the embodiments described herein. Those of skill in the art, however, will understand that the embodiments described herein may be practiced using various combinations of these elements.

Figure 2:
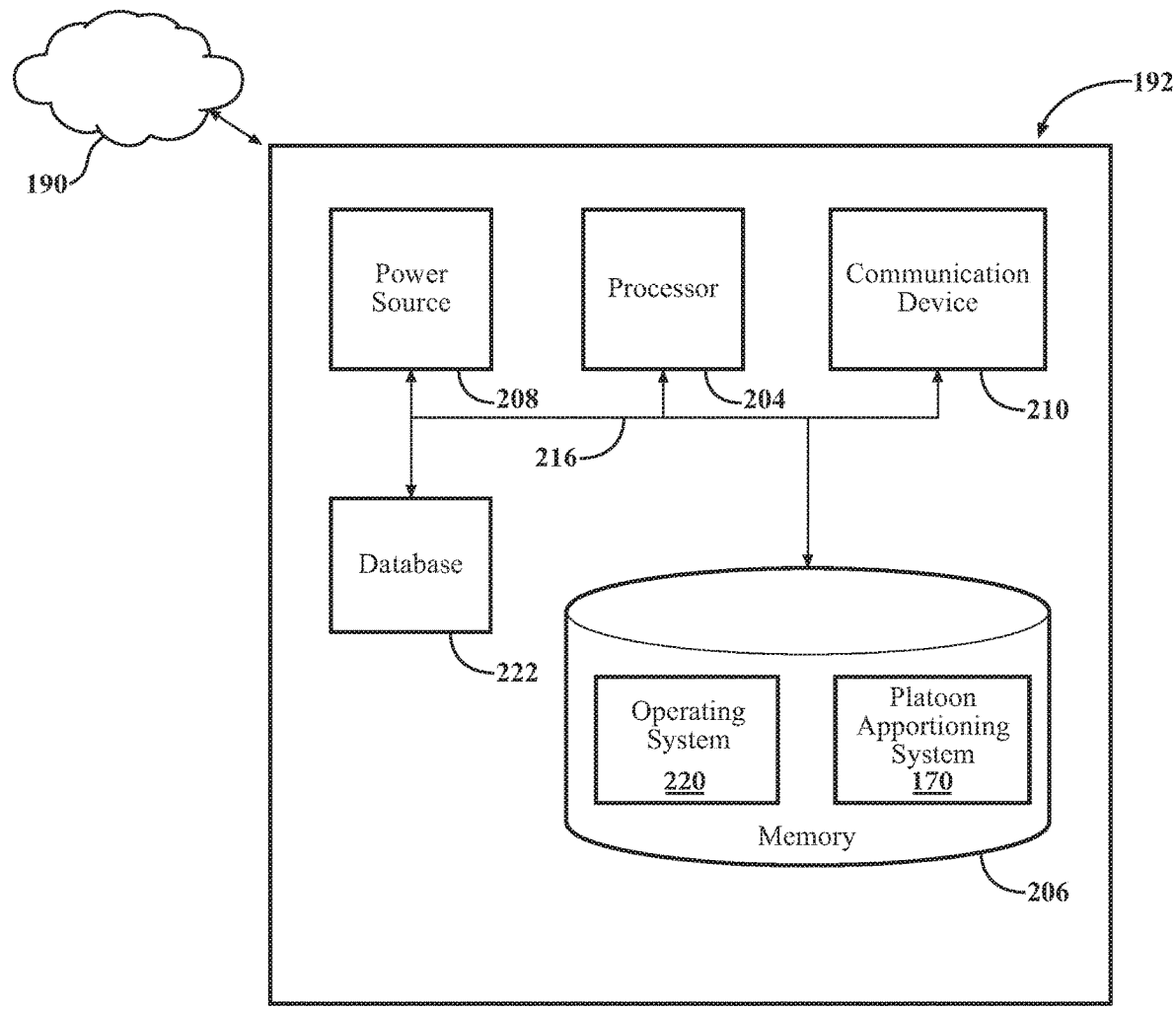
FIG. 2 is a block diagram of a server useable as part of the platoon apportioning system, according to embodiments described herein.

FIG. 2 is a block diagram of the server 192, as shown in FIG. 1, according to one or more embodiments. The server 192 can contain various components for performing the functions that are assigned to said server. The components can include a processor 204, like a central processing unit (CPU), a memory 206, a power source 208, communications device 210, input and/or output devices, and at least one bus 216 that connects the aforementioned components. In some embodiments, these components are at least partially housed within a housing 218.

The processor 204, which can also referred to as a central processing unit (CPU), can be a device which is capable of receiving and executing one or more instructions to perform a task as part of a computing device. In one embodiment, the processor 204 can include a microprocessor such as an application-specific instruction set processor (ASIP), graphics processing unit (GPU), a physics processing unit (PPU), a digital signal processor (DSP), an image processor, a co-processor, or others. Though referenced as the processor 204, it is understood that one or more processors 204 can be used in one or more embodiments described herein, including combinations of processors 204.

The memory 206 is any piece of hardware that is capable of storing data or information. Examples of data or information which can be stored in the memory 206 include, without limitation, data, program code in functional form, and/or other suitable information either on a temporary basis and/or a permanent basis. The memory 206 can include one or more modules that include computer readable instructions that, when executed by the processor 204, cause the processor 204 to perform methods and functions that are discussed herein. The memory 206 can include volatile and/or non-volatile memory. The memory 206 can further include a computer readable storage medium. Examples of suitable memory 206 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof.

The memory 206 can be a component of the processor(s) 204, or the memory 206 can be operably connected to the processor(s) 204 for use thereby. The memory 206 can include an operating system 220, such as LINUX. The operating system 220 can include batch, live, time sharing, real time, and other types of operating systems. The operating system 220, as described herein, can include instructions for processing, accessing, writing, storing, searching data, or other functions as selected by the user for controlling and providing interface with the server 192. The memory 206 can include communications procedures for communicating with the network 190, computing devices, the vehicle 100, and/or another server.

The communication device 210 can be wired or wireless connection components and/or software allowing the server 192 to communicate with other computing devices. The communication device 210 can allow communication with devices either locally or remotely, such as over a network protocol (e.g., Ethernet or similar protocols). In one example, the server 192 is connected to the network 190 using the communication device 210. The communication device 210 can further be connected with remote devices associated with other computing devices. In one example, the communication device 210 is connected with the sensors system 120 and the data store 115 through the vehicle 100. In further embodiments, the server 192 can connect with one or more servers, allowing access to one or more sensors, which are connected to or in connection with the second server. The one or more sensors can include one or more of the sensors of the sensor system 120, described with reference to FIG. 1.

The server 192 can further include the platoon apportioning system 170 or components thereof. As described herein, certain components of the platoon apportioning system 170 can be stored in the vehicle 100, in the server 192 or in combinations thereof. As such, one or more embodiments of the platoon apportioning system 170 can include the platoon apportioning system 170, modules thereof, or components thereof as being stored, collected, created, compared or otherwise made available from the memory 206 or the database 222 of the server 192. When stored as part of the server 192, the platoon apportioning system 170 can access the vehicle 100, another server 192, one or more sensors, or other devices through the communications device 210 and the network 190, allowing for continuity between the one or more components which comprise the platoon apportioning system 170, as disclosed herein.

Figure 3:
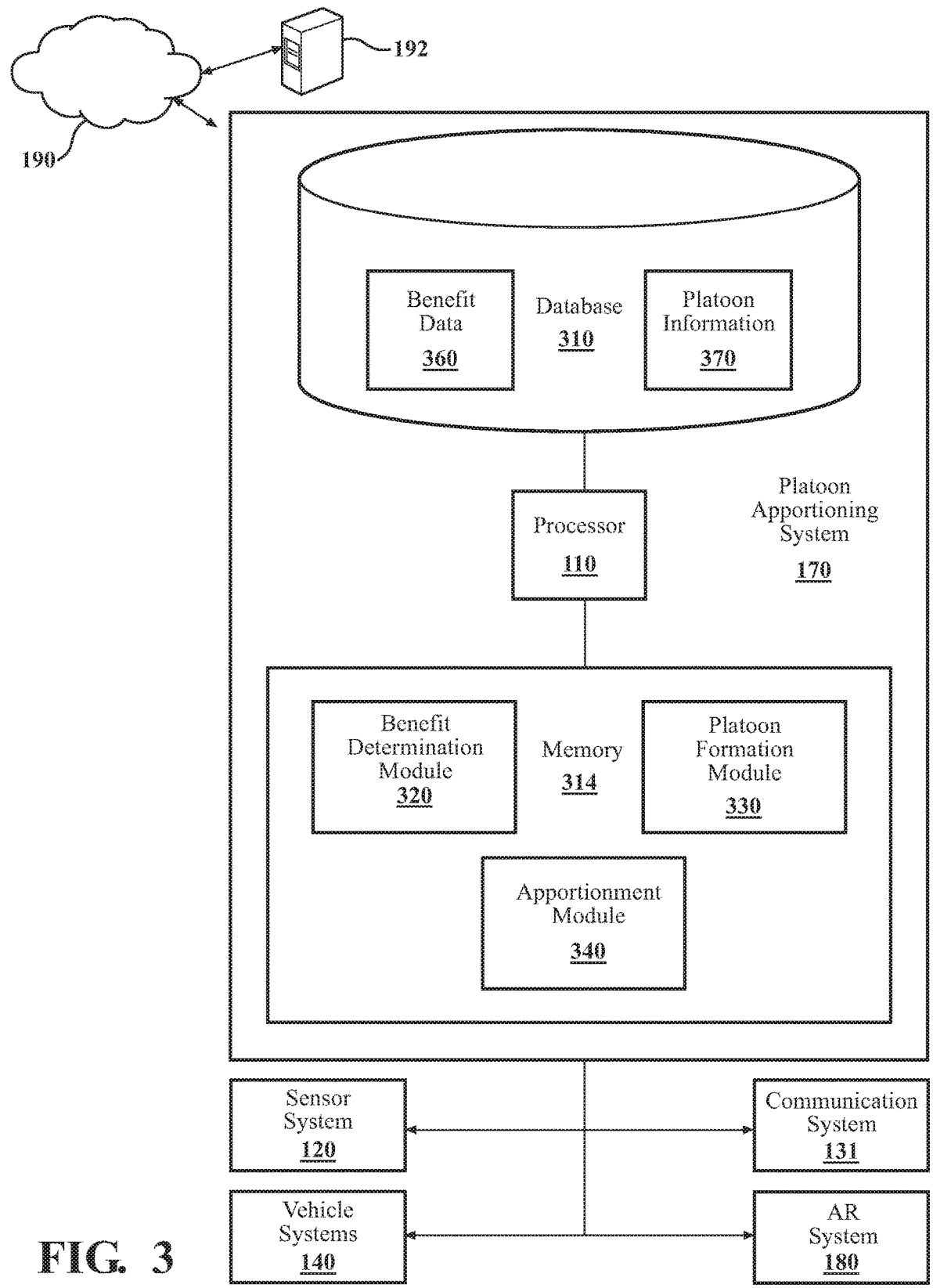
FIG. 3 is an illustration of the platoon apportioning system for vehicle positioning and benefit distribution in a vehicle platoon, according to embodiments described herein.

The discussion of the platoon apportioning system 170 begins at FIG. 3, with an illustration of the platoon apportioning system 170, according to one embodiment. The platoon apportioning system 170 is shown as including the processor 110 from the vehicle 100, depicted in FIG. 1. Accordingly, the processor 110 can be a part of the platoon apportioning system 170, the platoon apportioning system 170 can include a separate processor from the processor 110 or the platoon apportioning system 170 can access the processor 110 through a data bus or another communication path. In one embodiment, the platoon apportioning system 170 includes the memory 314 that stores a benefit determination module 320, a platoon formation module 330 and an apportioning module 340. The memory 314 is a random-access memory (RAM), read-only memory (ROM), a hard-disk drive, a flash memory, or other suitable memory for storing the modules 320, 330, and 340. The modules 320, 330, and 340 are, for example, computer-readable instructions that when executed by the processor 110, cause the processor 110 to perform the various functions disclosed herein.

The platoon apportioning system 170 can further include a database 310. The database 310 can be presented in a number of configurations, including as part of the memory 314, as an independent component from the memory 314, as part of a separate memory (distinct from memory 314), or others. The database 310 can include benefit data 360 and platoon information 370. The benefit data 360 can include data sets as detected or determined about each of the group of vehicles regarding aerodynamics, fuel efficiency, load tolerance and other details which can be used to determine the benefits which can be achieved by each of said vehicles during platooning. The benefit data 360 can include data sets from multiple vehicles, as transmitted through a network 190 from a server 192, as well as data collected from one or more sensors, such as from a sensor system 120. The platoon information 370 can include information related to platoon orders, platoon history and platoon arrangements which can achieve one or more travel benefits for the group of vehicles. Though the platoon apportioning system 170 is shown as part of the vehicle 100, the platoon apportioning system 170 or portions thereof, can be stored in a separate vehicle, on a computing device, such as the server 192, or others. As such, one or more of the functions of the platoon apportioning system 170 or of the modules contained therein, can be performed remotely and transferred to vehicle 100 as part of the embodiments described herein.

The benefit determination module 320 can generally include instructions that function to control the processor 110 to determine one or more cumulative travel benefits for a group of vehicles. The group of vehicles is two or more platoon-capable vehicles which can form or currently exist as part of a platoon. The platoon-capable vehicle can be a vehicle with one or more autonomous systems, allowing the vehicle to interact as part of a platoon. The platoon-capable vehicle can include a semi-autonomous vehicle. In embodiments where the platoon-capable vehicle includes more than one platoon-capable vehicle, one or more of said platoon-capable vehicles can be a fully autonomous vehicle. In SAE level 3 driving as described herein, there can be intervals where manual driving can be conditioned by the safety protocols. Further, the group of vehicles can be a selection of vehicles which are capable of being grouped but not physically close to one another at the time of grouping. As used herein, the platoon-capable vehicles can be substantially similar to or include one or more systems of the vehicle 100, described with reference to FIG. 1. Further, the group of vehicles can be selected by the benefit determination module 320 or they can be self-selecting, such as by request from the platoon-capable vehicle to the benefit determination module 320 to become part of a platoon.

A platoon, as used herein, is the linking of two or more vehicles in a convoy. The group of vehicles can achieve cumulative travel benefits as part of the platoon. The cumulative travel benefits are benefits to a variety of parameters, such as fuel efficiency, decreased vehicle wear, increased travel speed, or others, which is provided by being part of a platoon. The cumulative travel benefits can be broken down into individual platoon benefits and group platoon benefits. The benefit determination module 320 can determine the cumulative travel benefits through a variety of sources, such as individualized information (e.g., specific vehicle information collected over time), crowdsourcing, manufacturer specifications, simulations, and others. In one embodiment, the benefit determination module 320 can access one or more systems of the platoon-capable vehicle in determining vehicle parameters or environment parameters, such as the sensor system 120 or the vehicle systems 140, of the vehicle 100, described with reference to FIG. 1.

Individual platoon benefits are benefits that a select vehicle of the group of vehicles enjoys individually as part of the platoon (i.e., does not contribute to other platoon members). As each vehicle of the group of vehicles has specific shapes, mechanical dispositions, and other characteristics, it is understood that each vehicle can receive different benefits from being part of a platoon. For example, a platoon may provide a primary benefit of increased fuel efficiency for a semi-truck but much less with regards to preventing wear (with the expectation that semi trucks are designed with more resilient components to handle the weight of a heavy load). However, in the same example, a small car may benefit very little with regards to fuel efficiency (due to a highly efficient engine, low weight and small displacement area) but much more so with regards to safety. Further, these vehicles can achieve different benefits based on their position within the platoon. In one example, a vehicle may be more aerodynamic when behind another specific vehicle, to an extent that no other combination can achieve the same benefit. As such, the order of vehicles would confer an individual platoon benefit. Group platoon benefits are benefits which are generic to the group, and achieved when the group is a platoon. Group platoon benefits can include generic benefits such as increased overall speed and decreased overall fuel usage. Each of the vehicles of the group of vehicles can be examined for vehicle attributes that provide either an individual platoon benefit or a group platoon benefit, as part of the cumulative travel benefits.

The benefit determination module 320 can further include instructions to create a vehicle simulation to determine the cumulative travel benefits for each of the group of vehicle. The vehicle simulation can consider one or more characteristics about the vehicle to determine what benefits or what level of benefits can be reasonably achieved for the vehicle in a platoon. In one embodiment, the vehicle simulation can determine expectations of vehicle wear, fuel usage, maximum driving speed, load capacity and other factors which may be affected or may affect the vehicle as part of the platoon. The vehicle simulation can include physics, road types, condition of the vehicle in question, atmospheric phenomena and more to determine individual parameters and the related cumulative travel benefits of the platoon-capable vehicle. The cumulative travel benefits can be stored as part of the benefit data 360 in the database 310.

The one or more cumulative travel benefits can then be presented to the platoon formation module 330 for further processing. The platoon formation module 330 can generally include instructions that function to control the processor 110 to define a platoon organization to achieve at least a portion of the one or more cumulative travel benefits. The platoon organization is the various facets of vehicle interaction which define the platoon. The platoon organization can include vehicle positioning and order, inter-vehicle distance, platoon speed, lane-level positioning, and other attributes. The platoon organization can include changes to the platoon which are expected at one or more portions of the route, such as vehicles entering or exiting, order changes, or others. The platoon organization can be stored as part of the platoon information 370 in the database 310.

In further embodiments, there can be circumstances where one or more of the cumulative travel benefits cannot be fully achieved, or achieved at all, in light of other cumulative travel benefits. In one embodiment, the platoon formation module 330 can form a platoon organization which achieves all of the one or more cumulative travel benefits. In another embodiment, the platoon formation module 330 can form a platoon organization which achieves one or more of the one or more cumulative travel benefits. In another embodiment, the platoon formation module 330 can form a platoon organization which partially achieves one or more of the one or more cumulative travel benefits. In yet further embodiments, the cumulative travel benefits can be selected by the operator of the platoon-capable vehicle, such as based on priority. The operator can provide one or more inputs to the platoon formation module 330 through a communication device, such as the communication system 131, the AR system 180, other systems, or combinations thereof.

In one or more embodiments, the cumulative travel benefits that are selected by one or more operators can be referred to a selected travel benefits. The selected travel benefits can be determined using vehicle-specific efficiency information. Vehicle-specific efficiency information is information regarding benefits which are available to a specific vehicle, either by design or by modification, which can provide motivation for selection of one cumulative travel benefit over another. Vehicle-specific efficiency information can include protecting a vehicle from excess wear based on vehicle position in the platoon. Selected travel benefits based on vehicle-specific efficiency information may not provide an overall benefit to the platoon, and, as such, may incur added costs on the selecting vehicle.

In determining the platoon organization, the platoon formation module 330 can further include instructions to create a platoon simulation. The platoon simulation can present a variety of scenarios to compare one or more characteristics about the platoon to determine the platoon organization which provides the maximum available cumulative travel benefit can be achieved for the platoon. In one embodiment, the platoon simulation can determine inter-vehicle aerodynamics and fuel efficiency, crash resilience, platoon responsiveness and other factors which may be affected by or may affect the platoon. The platoon simulation can include criteria from the vehicle simulation, such as physics, road types, condition of the vehicle in question, atmospheric phenomena and others. The platoon simulation can further include individual parameters and the related cumulative travel benefits of the platoon-capable vehicle. The platoon simulation can be stored as part of the platoon information 370 in the database 310.

The platoon formation module 330 can optionally further include instructions to create a platoon for the group of vehicles using the platoon organization. The creation of the platoon can transmission of instructions to a selection of vehicles from the group of vehicles, such that one or more platoons are formed with consideration of the cumulative travel benefits available to each vehicle and each platoon. Using the platoon organization, the platoon formation module 330 can provide instructions to the platoon-capable vehicles for forming the platoon. The creation of the platoon can include map coordinates and timing for each of the vehicles, the timing and position for each platoon member, the minimum and maximum length of the platoon, refuel stops, if necessary, and others. In one embodiment, the platoon formation module 330 can define and position the lead vehicle and transmit coordinates for the location that the platoon will form. The platoon formation module 330 can connect with the vehicle 100 through a network, such as the network 190. In one embodiment, the platoon formation module 330 can be stored in the server 192 and can forward the platoon creation instructions to the platoon-capable vehicles, as selected by the platoon apportioning system 170, allowing each of the vehicles to move into platoon formation in a timely fashion.

The apportioning module 340 can generally include instructions that function to control the processor 110 to determine a benefit distribution of the cumulative travel benefits for the platoon organization. The benefit distribution is the effective spread of the cumulative travel benefits which are actualized (e.g., actualized benefits), as attributed to each of the vehicles in the platoon organization. The actualized benefits are the cumulative travel benefits, which by selection or circumstance, are actually achieved in the platoon, based on the platoon organization. The benefit distribution can be estimated, such as based on the platoon simulation, calculated, such as based on information received during and/or after the platoon is completed and/or disbanded, or combinations thereof. Further, the benefit distribution can include both the difference in benefit and possible compensation or distribution models. The distribution models are data sets which indicate how to equalize the benefit of the platoon organization between the vehicles of the platoon. The distribution models can include benefit equivalents in the form of real or virtual currency, credits for fuel, items of value, and/or others.

In determining the distribution model, the apportioning module 340 can receive input from the operator, regarding one or more desired forms of compensation. The operator can receive a communication from the apportioning module 340 regarding disparities in benefit distribution in the platoon. The apportioning module 340 can then provide an opportunity for selection of compensation to the operator. In one example, the apportioning module can, through the communications system 131 or the AR system 180, send a selection or list of possible compensations in the distribution model. In this embodiment, the operator can then select compensations of interest through the communications system 131 or the AR system 180, where apportioning module 340 saves the selection for future application. The selections, the distribution model, and the benefit distribution can be stored as part of the benefit data 360 in the database 310.

The apportioning module 340 can further include instructions that function to control the processor 110 to apportion the cumulative travel benefits to the group of vehicles based on the benefit distribution. The actualized benefits are associated to the vehicles based on the benefit distribution of the cumulative travel benefits. The apportioning of benefits can include some of the vehicles of the platoon providing said compensation. Using the benefit distribution, as optionally enhanced by the distribution model, the apportioning module 340 can then distribute the compensation to the platoon-capable vehicles to address disparities in benefit distribution in the platoon. The compensation can be delivered at any time that the vehicles are interacting with the platoon, such as during or after the platoon has ended. The compensation can be transferred or made available to the operator in a variety of ways, such as being transferred to an account, delivered to a third party on behalf of the operator, directly delivered or others.

Figure 4:
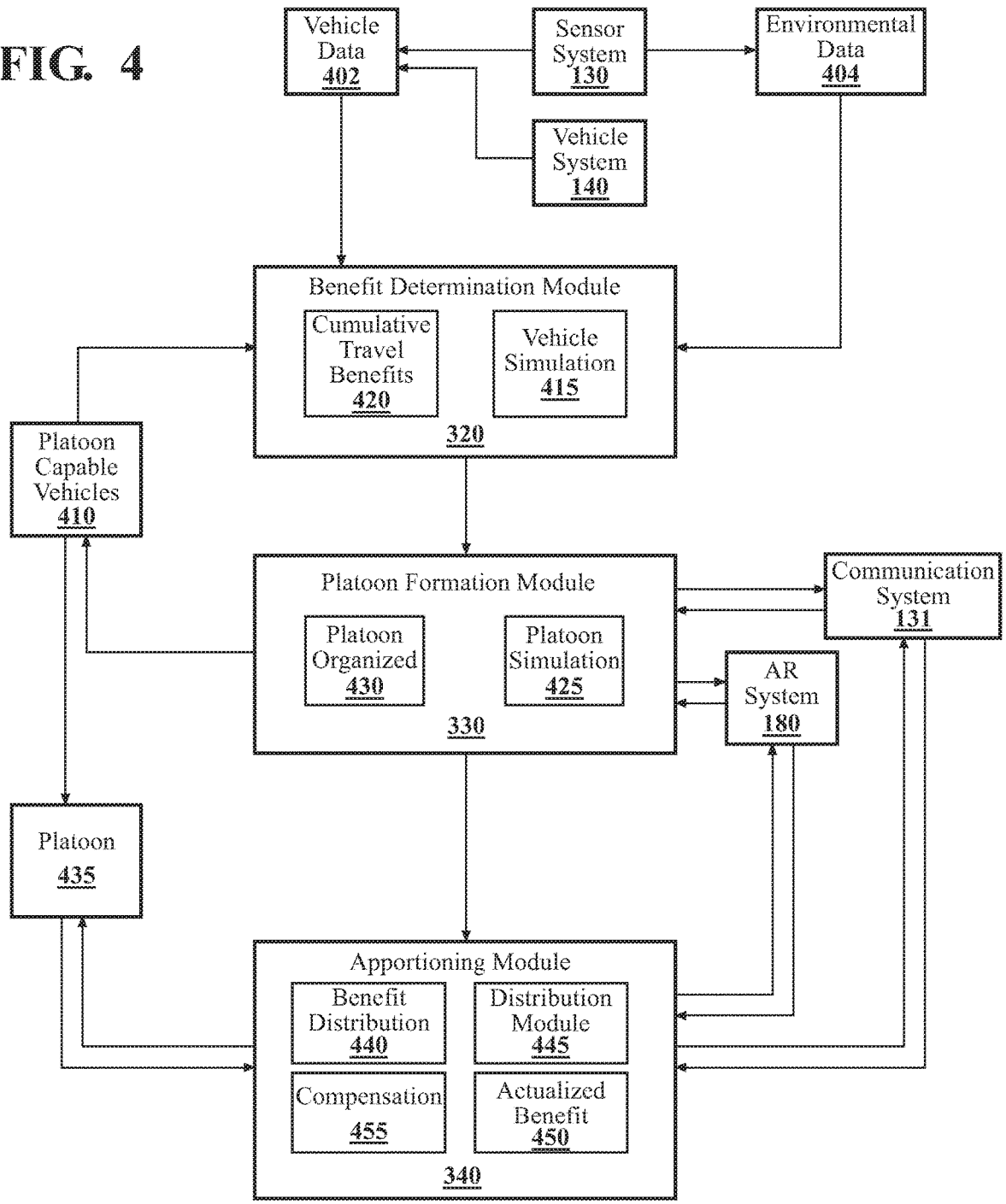
FIG. 4 is a schematic of the platoon apportioning system, according to one or more embodiments.

FIG. 4 depicts a schematic 400 of the platoon apportioning system 170, according to one or more embodiments. The platoon apportioning system 170 uses environmental and vehicle information for a group of platoon-capable vehicles to determine the cumulative travel benefits for the platoon capable vehicles. The platoon apportioning system 170 then forms a platoon organization for the platoon-capable vehicles which achieves the desired benefits based on the benefits available and conflicts between them. Further, the platoon apportioning system 170 then apportions the cumulative benefits to allow for equal advantage for all members. Thus, the platoon apportioning system 170, can allow for maximum benefit from a platoon formation while assuring that all members get an equal share of said benefit. The platoon-capable vehicles described in this example are described with reference to the systems and modules of the vehicle 100 of FIG. 1.

The schematic 400 of the platoon apportioning system 170 can begin with vehicle data 402 and environmental data 404 being delivered to the benefit determination module 320. The vehicle data 402 is the data collected by a sensor system about a group of platoon-capable vehicles 410, such as the sensor system 120, vehicle systems, such as the vehicle systems 140, and/or input given by a secondary source, such as a technician or an operator. The vehicle data 402 can include information derived as part of the vehicle characteristics, described above with reference to FIG. 3. The environmental data 404 is a data set of the vehicular environment, described above with reference to FIG. 3. The environmental data 404 can be collected using one or more sensors, such as the sensor system 120, described with reference to FIG. 3. The benefit determination module 320, as described above, includes instructions to determine the cumulative travel benefits 420. The cumulative travel benefits 420 are the benefits derived or estimated from travelling in the platoon over travelling solo. The cumulative travel benefits 420 can be substantially similar to the cumulative travel benefits described with reference to FIG. 3. The cumulative travel benefits 420 can be determined or estimated through the use of vehicle simulations 415. The vehicle simulations 415 can use the vehicle data 402 and the environmental data 404 to determine performance characteristics of the platoon-capable vehicles 410. The cumulative travel benefits 420 can then be forwarded to the platoon formation module 330, for further processing and application.

The platoon formation module 330 can then form a platoon organization 430 for the platoon-capable vehicles 410. The platoon organization 430 can include positioning and timing for the platoon-capable vehicle 410 such that at least one of the cumulative travel benefits 420 is achieved. The platoon organization 430 can be substantially similar to the platoon organization described with reference to FIG. 3. The selection of the cumulative travel benefits 420 can be selected, in part or in whole, by the operator or another party. In one embodiment, the platoon formation module 330 receives input from the platoon-capable vehicles through a communication device, such as the communication system 131 and/or the AR system 180 described with reference to FIG. 3. The platoon organization can further include input from a platoon simulation 425. The platoon simulation 425 is a simulation of one or more possible platoon organizations, incorporating vehicle data 402 and/or environmental data 404, to determine which vehicle organization achieves the selected cumulative travel benefit or the maximum cumulative travel benefit. The platoon formation module 330 can then forward the platoon organization 430 to the platoon-capable vehicles 410 for formation of the platoon 435. Further, the platoon formation module can then forward the platoon organization 430 and other platoon communications to the operator, using the communication device, such as the communication system 131 and/or the AR system 180 described with reference to FIG. 3.

The apportioning module 340 can then present instructions to determine the benefit distribution 440. The benefit distribution 440 is the distribution of compensation for the cumulative travel benefits 420 which were actually achieved by the platoon 435, i.e., actualized benefits 450. The benefit distribution 440 can further include input from a distribution model 445. The benefit distribution 440, distribution model 445, and the actualized benefit 450 can be substantially similar to the benefit distribution, distribution model, and the actualized benefit described with reference to FIG. 3. The benefit distribution 440 and the distribution model 445 can include operator input, such as received from the communication system 131 and/or the AR system 180 of the vehicle 100 described with reference to FIG. 3. The benefit distribution 440 can further include transfers of compensation from one or more members of the platoon 435, such as when one of the platoon members has received more benefit than the average benefit from the benefit distribution 440. Compensation 455 can then be forwarded to the platoon 435, based on the benefit distribution 440. The compensation 455 can be substantially similar to the compensation described with reference to FIG. 3.

Thus, by making an optimum benefit determination for platoon organization followed by distribution of said benefits, the platoon apportioning system 170 provides numerous benefits to platooned drivers. The platoon apportioning system 170 can provide guidance to the platooned drivers as to which organizations provide the highest benefit to all vehicles. Further, the platoon apportioning system 170 provides incentive for all platooned drivers to join the platoon in an optimal manner. As well, the platoon apportioning system 170 provides equitable distribution of benefits, allowing parties to share in the gains provided to the platoon by the platoon apportioning system 170.

Figure 5A:
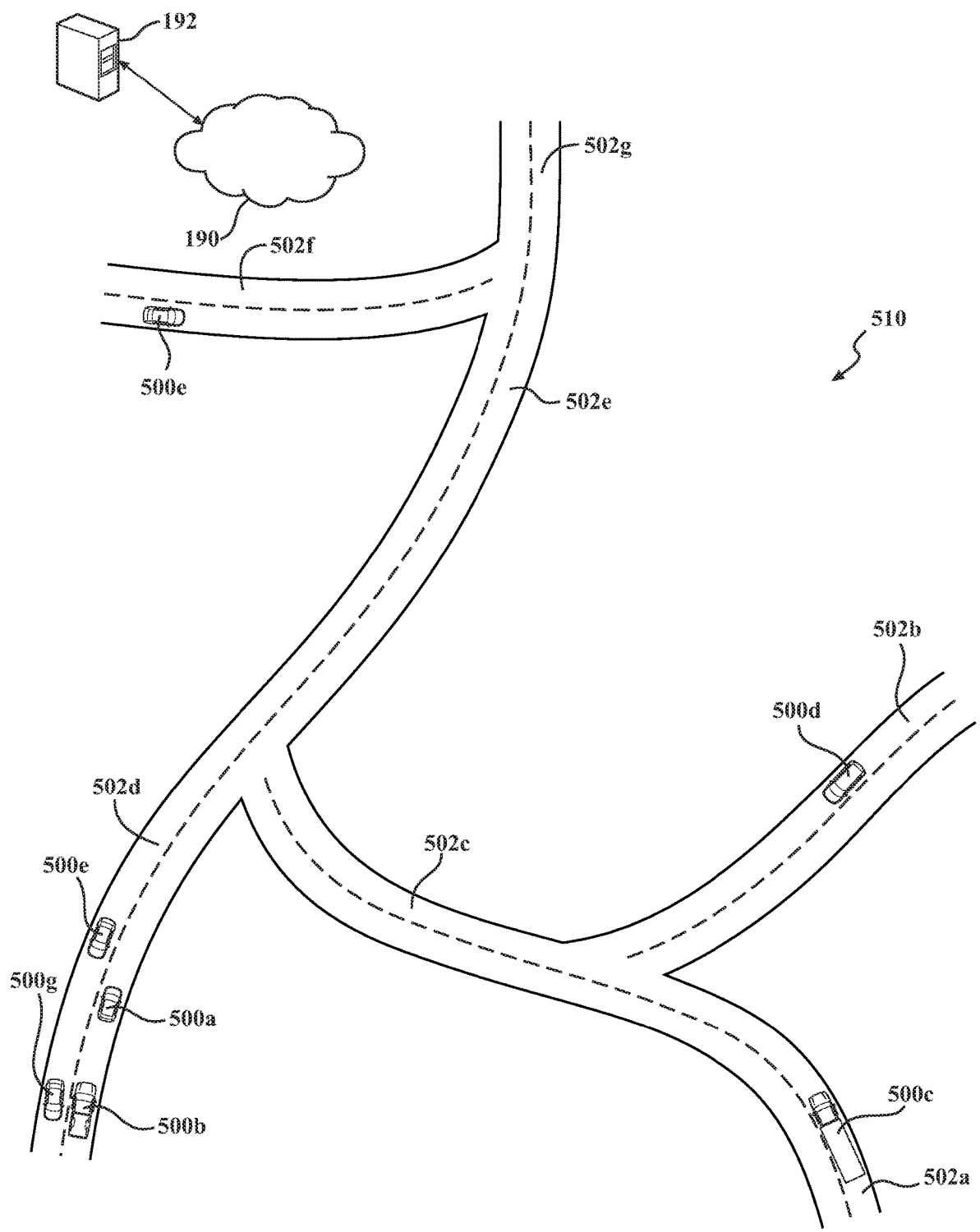
Figure 5B:
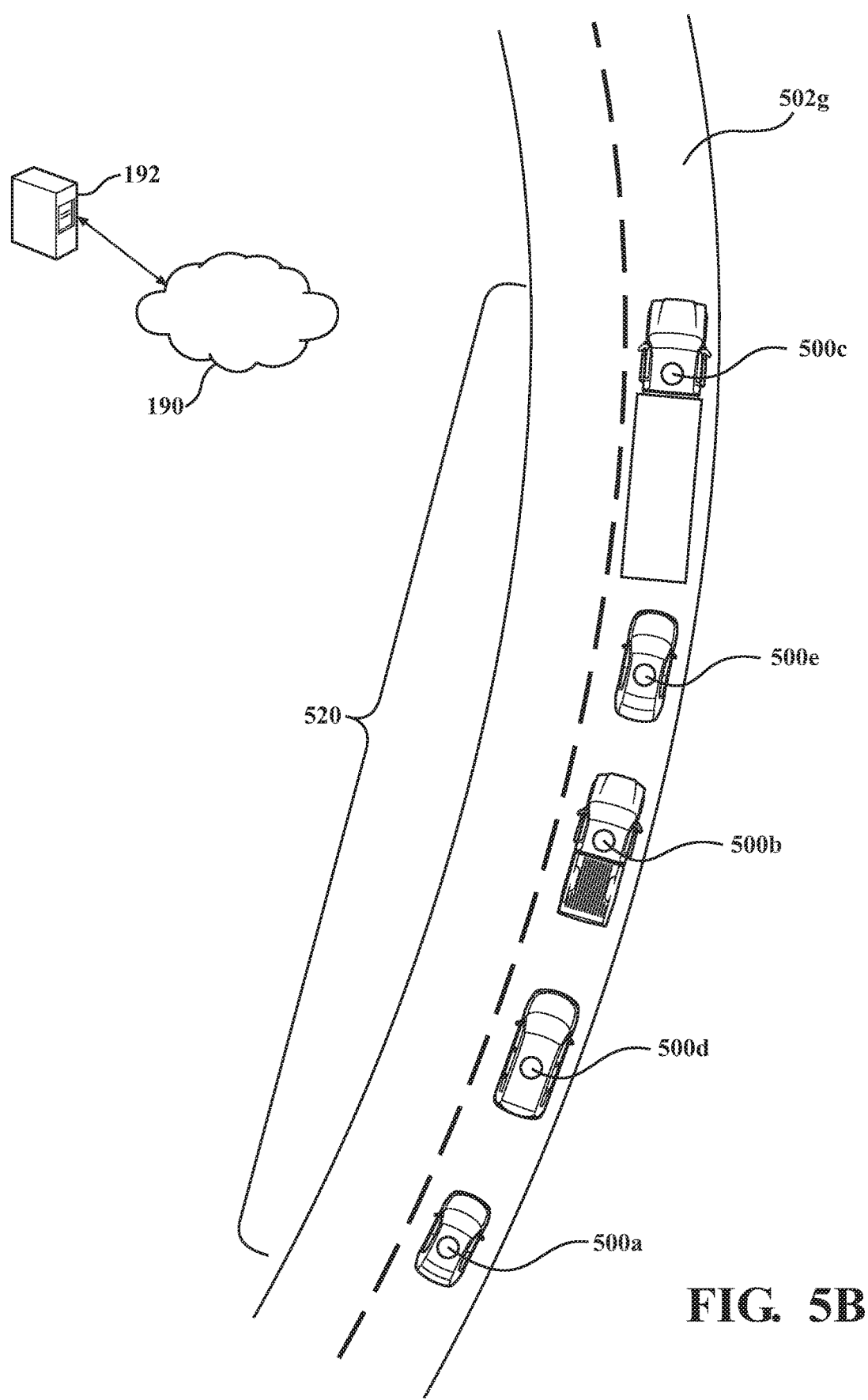

FIGS. 5A, 5B, and 5C depict a plurality of vehicles 500a, 500b, 500c, 500d, and 500e in a vehicular environment 510 employing the platoon apportioning system 170, according to one or more embodiments. FIG. 5A depicts the vehicles 500a, 500b, 500c, 500d, 500e, 500f, and 500g in a vehicular environment 510, according to one embodiment. FIG. 5B depicts the vehicles 500a, 500b, 500c, 500d, and 500e in the vehicular environment 510, according to one embodiment. FIG. 5C depicts an exemplary passenger compartment 550 for the vehicles 500, according to one embodiment. In FIG. 5A, the vehicles 500a, 500b, 500c, 500d, 500e, 500f, and 500g are travelling through the vehicular environment 510. The vehicles 500a, 500b, 500c, 500d, 500e, 500f, and 500g can be substantially similar to the vehicle 100, described with reference to FIG. 1, including any or all elements described therein. The vehicular environment 510 can include a series of merging roads, such as can be seen on a standard highway. Shown here, a first road 502a merges with a second road 502b to form the third road 502c. The third road 502c then merges with the fourth road 502d, to form the fifth road 502e. Then, the fifth road 502e merges with the sixth road 502f, to form the seventh road 502g. The vehicles 500a, 500b, 500f, and 500g are travelling on the fourth road 502d through the vehicular environment 510. The vehicle 500c is shown driving on the first road 502a toward the third road 502c. The vehicle 500d is shown driving on the second road 502b toward the third road 502c. The vehicle 500e is shown driving on the sixth road 502f toward the seventh road 502g.

In this example, the vehicles 500a, 500b, 500c, 500d, 500e, 500f, and 500g request to join or form a platoon. The request from the vehicles 500a, 500b, 500c, 500d, 500e, 500f, and 500g is then received by the server 192, through the network 190. The platoon apportioning system 170 then receives or accesses the vehicle data 402 and the environmental data 404, as collected from a variety of sources, such as the vehicles 500, public data (e.g., weather reports), infrastructure-based sensors (e.g., an image capture device on a tower or building near the road), reported information about one or more of the vehicles 500 (e.g., damage to the vehicle reported by a technician or operator, etc.), ort other sources of information relevant to the performance of the vehicles 500 in the vehicular environment 510. The benefit determination module 320 receives the vehicle data 402 and the environmental data 404 and determines the cumulative travel benefits for the vehicles 500. At this point, the platoon apportioning system 170 or the benefit determination module 320 can determine that vehicles 500f and 500g are not possible members of the group of vehicles for the platoon. In other embodiments, this determination can be made at a later time or based on confirmation form the vehicles 500f and 500g that they will not be joining the platoon as formed.

The vehicles 500a, 500b, 500c, 500d, and 500e, can all have different body shapes, designs, engine types and sizes, body damage, unknown deterioration, or others. As shown here, the vehicle 500a is a small car with a dent in the right front quarter panel, which affects the aerodynamics. The vehicle 500b is a medium size truck, with a bed cover and worn brake calipers, causing the brake pads to drag on the left side. The vehicle 500c is a semi-truck with no known issues or deformations. The vehicle 500d is a mini-van with no known issues or deformations. The vehicle 500e is a mid-size car with no known deformations or issues. The benefit determination module 320 then provides the vehicle simulation for each of the vehicles 500a, 500b, 500c, 500d, and 500e and prepares a number of data points regarding the cumulative travel benefits 420 for each of said vehicles. The cumulative travel benefits 420 are then stored as part of the benefit data 360 and/or forwarded to the platoon formation module 330 for further application and processing.

The platoon formation module 330 can then form a platoon organization 430 for the vehicles 500a, 500b, 500c, 500d, and 500e. The platoon formation module 330 can include instructions to create a platoon organization 430 which provides maximum of the cumulative travel benefits. In further embodiments, the platoon formation module 330 can receive a selection of the cumulative travel benefits from the vehicles 500a, 500b, 500c, 500d, and 500e, using the communications system 131 and the AR system 180, shown with reference to FIG. 3 and discussed with respect to the embodiments of FIG. 5A and FIG. 5B, in FIG. 5C. The platoon organization 430 can be chosen based on parameters of the vehicle, selected parameters, the platoon simulation 425, or combinations thereof. The platoon formation module 330 can create a variety of vehicle arrangements for the platoon. Then, the vehicle arrangements are run in a platoon simulation 425 to determine which ones provide the maximum benefit based on the cumulative travel benefits and one or more selected benefits. The platoon organization 430 can then forwarded or otherwise made available through the network 190 to the vehicles 500a, 500b, 500c, 500d, and 500e. The vehicles 500a, 500b, 500c, 500d, and 500e then move through the vehicular environment as directed by the platoon organization 430.

As shown in FIG. 5B, the vehicles 500a, 500b, 500c, 500d, and 500e form a platoon 520, based on the platoon organization 430. The vehicles 500a, 500b, 500c, 500d, and 500e merged in the seventh road 502g and organized according to the vehicle positioning of the platoon organization 430. As shown here in this example, the platoon organization 430 chosen positioned the vehicle 500c first, the vehicle 500e second, the vehicle 500b third, the vehicle 500d fourth, and the vehicle 500a fifth, to achieve maximum aerodynamics and crash protection. The vehicles 500a, 500b, 500c, 500d, and 500e then continue along the route until said vehicles reach the predetermined end point of the platoon 520 or until the vehicles 500a, 500b, 500c, 500d, and 500e separate from the platoon 520 on their own accord. The platoon formation module 330 can further include the point where the platoon will dissolve in the platoon organization 430.

The apportioning module 340 can collect information from the platoon 520 regarding the actualized benefits 450. The actualized benefits 450 are the benefits actually achieved of the cumulative travel benefits 420 by the platoon and can include fuel savings and crash protection. As expected based on this organization, regardless the actualized benefit seen to vehicles 500a, 500b, 500d, and 500e, vehicle 500c receives almost no benefit from the platoon 520 based on the cumulative travel benefits 420 alone. Thus, the apportioning module 340 provides a benefit distribution 440. The benefit distribution 440 is a determination of how the actualized benefits would be distributed between the vehicles 500a, 500b, 500c, 500d, and 500e such that all of said vehicles benefit equally from the platoon 520. In this example, the vehicles 500a, 500b, 500d, and 500e provide some form of compensation to the apportioning module 340, which is then transferred to the vehicle 500c, either as received or in a form which benefits the vehicle 500c. As shown here, the vehicle 500c can communicate with the apportioning module 340 through the network 190 using the communication system 131 and/or the AR system 180. The communication can include an indication or selection of the type of compensation 455 that the vehicle 500c would like or can use. The apportioning module 340 can then provide said compensation 455 to the vehicle 500c either during the platoon 520 or after the platoon 520 has dissolved.

FIG. 5C depicts an exemplary passenger compartment 550 for the vehicles 500a, 500b, 500c, 500d, and 500e. The passenger compartment 550 can include a variety of vehicle-appropriate components, including a steering wheel 554, and a dashboard 556. The passenger compartment 550 can further include the communication system 131, depicted here as including a display (such as a screen display 558 or an augmented reality display 568), a microphone 560, an image capture device 562, and one or more speakers 564. The system 170 can begin with instructions from the platoon formation module 330, after receiving the cumulative travel benefits 420 from the platoon formation module 330. In this example, the platoon formation module 330 has received the cumulative travel benefits 420 from the benefit determination module 320 and is requesting information from the operator regarding selection of one or more benefits.

By either prompt from the platoon formation module 330 or impromptu from the vehicle operators/passengers 552, the vehicle operators/passengers 552 can then provide a selection of one or more of the cumulative travel benefits 420 through the communication system 131. In this embodiment, the platoon formation module 330 then determines the platoon organization 430 based on the platoon simulations 425, as provided by the server 192, and the selections of one or more the cumulative travel benefits 420. As used herein, the vehicles 500a, 500b, 500c, 500d, and 500e or the vehicle operators/passengers 552 may be described as providing information to the platoon apportioning system 170. However, it is understood that the vehicle operator/passenger 552 of the respective vehicle, of the vehicles 500a, 500b, 500c, 500d, and 500e, is providing the selection or other interaction.

The vehicles 500a, 500b, 500c, 500d, and 500e provide a selection to the platoon formation module 330 or to the apportioning module 340 using the communication system 131. The selection between the vehicles 500a, 500b, 500c, 500d, and 500e can be non-uniform, in that each of the vehicles 500a, 500b, 500c, 500d, and 500e select a different benefit of the cumulative travel benefits 420 or compensation 455, as desired.

Figure 6:
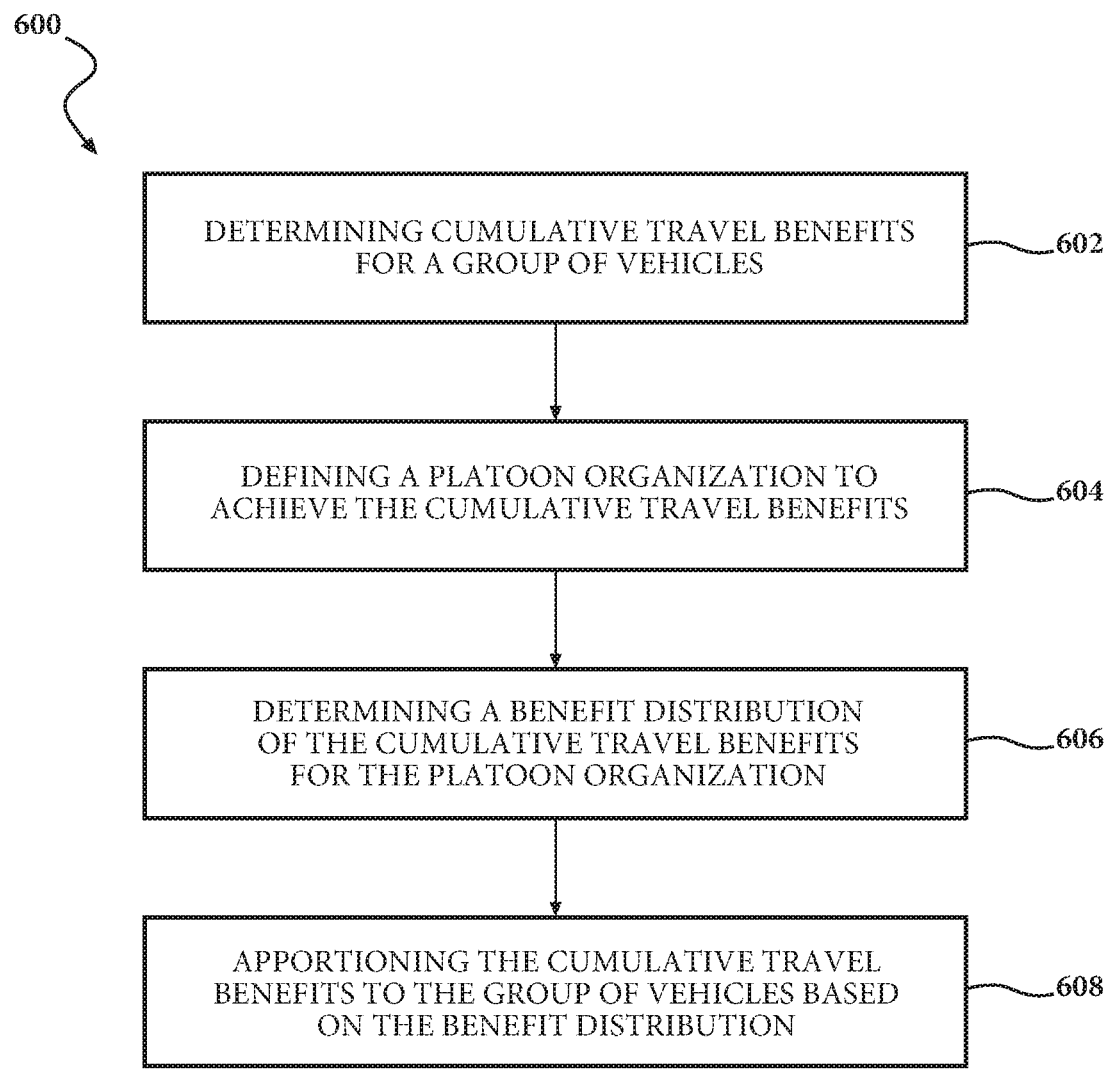
FIG. 6 is a block diagram of a method for vehicle positioning and benefit distribution in a vehicle platoon, according to one or more embodiments.

FIG. 6 is a block diagram of a method 600 for vehicle positioning and benefit distribution in a vehicle platoon, according to one or more embodiments herein. The method 600 determines the benefits achievable by a platoon between one or more vehicles. Then, the vehicles are organized in the platoon to achieve the maximum benefit or desired benefit level. Finally, the benefits are apportioned among the platoon members to provide equal benefit to all members. Thus, the method 600 allows the achievement of desired benefit levels by a platoon and sharing the benefit among the platoon. As described herein, the method 600 can include determining one or more cumulative travel benefits for a group of vehicles, at 602. A platoon organization can then be defined to achieve at least a portion of the one or more cumulative travel benefits, at 604. Then a benefit distribution of the cumulative travel benefits can be determined for the platoon organization, at 606. The cumulative travel benefits can then be apportioned to the group of vehicles based on the benefit distribution, at 608.

The method 600 can begin with determining one or more cumulative travel benefits for a group of vehicles, at 602. The cumulative travel benefits are benefits to a variety of parameters, such as fuel efficiency, decreased vehicle wear, increased travel speed, or others, which is provided by being part of a platoon. The cumulative travel benefits can be broken down into individual platoon benefits and group platoon benefits. The method 600 can determine the cumulative travel benefits through a variety of sources, such as individualized information (e.g., specific vehicle information collected over time), crowdsourcing, manufacturer specifications, simulations, and others. The cumulative travel benefits can include individual platoon benefits and group platoon benefits. Individual platoon benefits are benefits that a select vehicle of the group of vehicles enjoys individually as part of the platoon (i.e., does not contribute to other platoon members). Group platoon benefits are benefits which are generic to the group, and achieved when the group is a platoon. Group platoon benefits can include generic benefits such as increased overall speed and decreased overall fuel usage. Each of the vehicles of the group of vehicles can be examined for vehicle attributes that provide either an individual platoon benefit or a group platoon benefit, as part of the cumulative travel benefits. The method 600 further includes a vehicle simulation for determining the cumulative travel benefits. The vehicle simulation can be substantially similar to the vehicle simulation described with reference to FIGS. 3 and 4.

The determination of the cumulative travel benefits for the group of vehicles can be performed as part of a system, such as the platoon apportioning system 170, described with reference to FIG. 3. The platoon apportioning system 170 can include the benefit determination module 320. The benefit determination module 320 can generally include instructions that function to control the processor 110 to determine one or more cumulative travel benefits for a group of vehicles. The cumulative travel benefits can be substantially similar to the cumulative travel benefits, described with reference to FIGS. 3 and 4. The cumulative travel benefit can be collected in a substantially similar fashion to the cumulative travel benefits, described with reference to FIGS. 3 and 4. The benefit determination module 320, to determine the cumulative travel benefits, can access one or more systems of the platoon-capable vehicle in determining vehicle parameters or environment parameters, such as the sensor system 120 or the vehicle systems 140, of the vehicle 100, described with reference to FIG. 1. The cumulative travel benefits can be stored as part of the benefit data 360. The benefit data 360 can be stored in a database, such as the database 310, described with reference to FIG. 3.

A platoon organization can then be defined to achieve at least a portion of the one or more cumulative travel benefits, at 604. The platoon organization is the various facets of vehicle interaction which define the platoon. The platoon organization can include vehicle positioning and order, inter-vehicle distance, platoon speed, lane-level positioning, and other attributes. The platoon organization can include changes to the platoon which are expected at one or more portions of the route, such as vehicles entering or exiting, order changes, or others. In further embodiments, there can be circumstances where one or more of the cumulative travel benefits cannot be fully achieved, or achieved at all, in light of other cumulative travel benefits. In one embodiment, the method 600 can form a platoon organization which achieves all of the one or more cumulative travel benefits. In another embodiment, the method 600 can form a platoon organization which achieves one or more of the one or more cumulative travel benefits.

In determining the platoon organization, the method 600 can further include instructions to create a platoon simulation. The platoon simulation can present a variety of scenarios to compare one or more characteristics about the platoon to determine the platoon organization which provides the maximum available cumulative travel benefit can be achieved for the platoon. In one embodiment, the platoon simulation can determine inter-vehicle aerodynamics and fuel efficiency, crash resilience, platoon responsiveness and other factors which may be affected by or may affect the platoon. The platoon simulation can include criteria from the vehicle simulation, such as physics, road types, condition of the vehicle in question, atmospheric phenomena and others. The platoon simulation can further include individual parameters and the related cumulative travel benefits of the platoon-capable vehicle.

The defining a platoon organization for the group of vehicles can be performed as part of a system, such as the platoon apportioning system 170, described with reference to FIG. 3. The platoon apportioning system 170 can include the platoon formation module 330. The platoon formation module 330 can generally include instructions that function to control the processor 110 to define a platoon organization to achieve at least a portion of the one or more cumulative travel benefits. The platoon organization can be determined in a substantially similar fashion to the platoon organization, including by using the platoon simulation, described with reference to FIGS. 3 and 4. The benefit determination module 320, to determine the platoon organization, can access one or more systems of the platoon-capable vehicle in determining vehicle parameters or environment parameters, such as the sensor system 120 or the vehicle systems 140, of the vehicle 100, described with reference to FIG. 1. The platoon organization can be stored as part of the platoon information 370. The platoon simulation can be stored as part of the platoon information 370. The platoon information 370 can be stored in a database, such as the database 310, described with reference to FIG. 3.

Optionally, a platoon for the group of vehicles can be created using the platoon organization. The creation of the platoon can be a selection of vehicles from the group of vehicles, such that one or more platoons are formed with consideration of the cumulative travel benefits available to each vehicle and each platoon. Using the platoon organization, the method 600 can provide instructions to the platoon-capable vehicles for forming the platoon. The creation of the platoon can include map coordinates and timing for each of the vehicles, the timing and position for each platoon member, the minimum and maximum length of the platoon, refuel stops, if necessary, and others. In one embodiment, the method 600 can define and position the lead vehicle and transmit coordinates for the location that the platoon will form.

The creation of the platoon can be performed as part of a system, such as the platoon apportioning system 170, described with reference to FIG. 3. The platoon apportioning system 170 can include the platoon formation module 330. The platoon formation module 330 can further include instructions to create a platoon for the group of vehicles using the platoon organization. The platoon organization can be transmitted by the platoon formation module 330 to the platoon-capable vehicles, as described with reference to FIGS. 3 and 4. The platoon formation module 330 can connect with the vehicle 100 through a network, such as the network 190. In one embodiment, the platoon formation module 330 can be stored in the server 192 and can forward the platoon creation instructions to the platoon-capable vehicles, as selected by the platoon apportioning system 170, allowing each of the vehicles to move into platoon formation in a timely fashion. The platoon creation instructions can be stored as part of the platoon information 370. The platoon information 370 can be stored in a database, such as the database 310, described with reference to FIG. 3.

The benefit distribution of the cumulative travel benefits can then be determined for the platoon organization, at 606. The benefit distribution is the effective spread of the cumulative travel benefits, as attributed to each of the vehicles in the platoon. The benefit distribution can be estimated, such as based on the platoon simulation, calculated, such as based on information received during and/or after the platoon is completed and/or disbanded, or combinations thereof. The benefit distribution can include both the difference in benefit and possible compensation or distribution models. The distribution models can include benefit equivalents in the form of real or virtual currency, credits for fuel, items of value, and/or others. In determining the distribution model, the method 600 can receive input from the operator, regarding one or more desired forms of compensation. The operator can receive a communication from the method 600 regarding disparities in benefit distribution in the platoon. The method 600 can then send a selection or list of possible compensations in the distribution model. The operator can then select compensations of interest through the communications system 131 or the AR system 180, where method 600 saves the selection for future application.

The determination of the benefit distribution can be performed as part of a system, such as the platoon apportioning system 170, described with reference to FIG. 3. The platoon apportioning system 170 can include the apportioning module 340. The apportioning module 340 can generally include instructions that function to control the processor 110 to determine the benefit distribution of the platoon. The apportioning module 340 can connect with the vehicle 100 through a network, such as the network 190. In one embodiment, the apportioning module 340 can be stored in the server 192 and can receive information from the platoon-capable vehicles for the benefit distribution. The selections, the distribution model, and the benefit distribution can be stored as part of the benefit data 360. The benefit data 360 can be stored in a database, such as the database 310, described with reference to FIG. 3.

The cumulative travel benefits can then be apportioned to to the group of vehicles based on the benefit distribution, at 608. The actualized benefits are associated to the vehicles based on the benefit distribution. The apportioning of benefits can include some of the vehicles of the platoon providing said compensation. Using the benefit distribution, as optionally enhanced by the distribution model, the method 600 can then distribute the compensation to the platoon-capable vehicles to address disparities in benefit distribution in the platoon. The compensation can be delivered at any time that the vehicles are interacting with the platoon, such as during or after the platoon has ended. The compensation can be transferred or made available to the operator in a variety of ways, such as being transferred to an account, delivered to a third party on behalf of the operator, directly delivered or others.

The determination of the benefit distribution can be performed as part of a system, such as the platoon apportioning system 170, described with reference to FIG. 3. The platoon apportioning system 170 can include the apportioning module 340. The apportioning module 340 can further include instructions that function to control the processor 110 to apportion the actualized benefits to the one or more platoon members based on the benefit distribution. The information regarding the actualized benefit can be transmitted by the platoon-capable vehicles to the apportioning module 340, as described with reference to FIGS. 3 and 4. The apportioning module 340 can connect with the vehicle 100 through a network, such as the network 190. In one embodiment, the apportioning module 340 can be stored in the server 192 and can receive information from the platoon-capable vehicles for the actualized benefits and the selection of compensation. The compensation and the actualized benefits can be stored as part of the benefit data 360. The benefit data 360 can be stored in a database, such as the database 310, described with reference to FIG. 3.

FIG. 1 will now be discussed in full detail as an example vehicle environment within which the system and methods disclosed herein may operate. In some instances, the vehicle 100 is configured to switch selectively between an autonomous mode, one or more semi-autonomous operational modes, and/or a manual mode. Such switching also referred to as handover when transitioning to a manual mode can be implemented in a suitable manner, now known or later developed. "Manual mode" means that all of or a majority of the navigation and/or maneuvering of the vehicle is performed according to inputs received from an operator (e.g., a human user/driver).

In one or more embodiments, the vehicle 100 is an autonomous vehicle. As used herein, "autonomous vehicle" refers to a vehicle that operates in an autonomous mode. "Autonomous mode" refers to navigating and/or maneuvering the vehicle 100 along a travel route using one or more computing devices to control the vehicle 100 with minimal or no input from an operator. In one or more embodiments, the vehicle 100 is highly automated or completely automated. In one embodiment, the vehicle 100 is configured with one or more semi-autonomous operational modes in which one or more computing devices perform a portion of the navigation and/or maneuvering of the vehicle along a travel route, and a vehicle operator provides inputs to the vehicle to perform a portion of the navigation and/or maneuvering of the vehicle 100 along a travel route. Thus, in one or more embodiments, the vehicle 100 operates autonomously according to a particular defined level of autonomy. For example, the vehicle 100 can operate according to the Society of Automotive Engineers (SAE) automated vehicle classifications 0-5. In one embodiment, the vehicle 100 operates according to SAE level 2, which provides for the autonomous driving module 160 controlling the vehicle 100 by braking, accelerating, and steering without operator input but the operator is to monitor the driving and be vigilant and ready to intervene with controlling the vehicle 100 if the autonomous driving module 160 fails to properly respond or is otherwise unable to adequately control the vehicle 100.

The vehicle 100 can include one or more processors 110. In one or more arrangements, the processor(s) 110 can be a main processor of the vehicle 100. For instance, the processor(s) 110 can be an electronic control unit (ECU). The vehicle 100 can include one or more data stores 115 for storing one or more types of data. The data store 115 can include volatile and/or non-volatile memory. Examples of suitable data stores 115 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 115 can be a component of the processor(s) 110, or the data store 115 can be operably connected to the processor(s) 110 for use thereby. The term "operably connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. The map data 116 can be in any suitable form. In some instances, the map data 116 can include aerial views of an area. In some instances, the map data 116 can include ground views of an area, including 360-degree ground views. The map data 116 can include measurements, dimensions, distances, and/or information for one or more items included in the map data 116 and/or relative to other items included in the map data 116. The map data 116 can include a digital map with information about road geometry. The map data 116 can be high quality and/or highly detailed.

In one or more arrangement, the map data 116 can include one or more terrain maps 117. The terrain map(s) 117 can include information about the ground, terrain, roads, surfaces, and/or other features of one or more geographic areas. The terrain map(s) 117 can include elevation data in the one or more geographic areas. The map data 116 can be high quality and/or highly detailed. The terrain map(s) 117 can define one or more ground surfaces, which can include paved roads, unpaved roads, land, and other things that define a ground surface.

In one or more arrangement, the map data 116 can include one or more static obstacle maps 118. The static obstacle map(s) 118 can include information about one or more static obstacles located within one or more geographic areas. A "static obstacle" is a physical object whose position does not change or substantially change over a period of time and/or whose size does not change or substantially change over a period of time. Examples of static obstacles include trees, buildings, curbs, fences, railings, medians, utility poles, statues, monuments, signs, benches, furniture, mailboxes, large rocks, hills. The static obstacles can be objects that extend above ground level. The one or more static obstacles included in the static obstacle map(s) 118 can have location data, size data, dimension data, material data, and/or other data associated with it. The static obstacle map(s) 118 can include measurements, dimensions, distances, and/or information for one or more static obstacles. The static obstacle map(s) 118 can be high quality and/or highly detailed. The static obstacle map(s) 118 can be updated to reflect changes within a mapped area.

The one or more data stores 115 can include map data 116 and/or sensor data 119. In this context, "map data" refers to any data providing relative proximity between two objects, usable by the vehicle 100, one or more systems of the vehicle 100, or the operator. "Sensor data" means any information about the sensors that the vehicle 100 is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information on one or more LIDAR sensors 124 of the sensor system 120. In some instances, at least a portion of the map data 116 and/or the sensor data 119 can be located in one or more data stores 115 located onboard the vehicle 100. Alternatively, or in addition, at least a portion of the map data 116 and/or the sensor data 119 can be located in one or more data stores 115 that are located remotely from the vehicle 100.

As noted above, the vehicle 100 can include the sensor system 120. The sensor system 120 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors can function independently from each other. Alternatively, two or more of the sensors can work in combination with each other. In such a case, the two or more sensors can form a sensor network. The sensor system 120 and/or the one or more sensors can be operably connected to the processor(s) 110, the data store(s) 115, and/or another element of the vehicle 100 (including any of the elements shown in FIG. 1). The sensor system 120 can acquire data of at least a portion of the external environment of the vehicle 100 (e.g., nearby vehicles).

The sensor system 120 can include any suitable type of sensor. Various examples of different types of sensors will be described herein. However, it will be understood that the embodiments are not limited to the particular sensors described. The sensor system 120 can include one or more vehicle sensors 121. The vehicle sensor(s) 121 can detect, determine, and/or sense information about the vehicle 100 itself. In one or more arrangements, the vehicle sensor(s) 121 can be configured to detect, and/or sense position and orientation changes of the vehicle 100, such as, for example, based on inertial acceleration. In one or more arrangements, the vehicle sensor(s) 121 can include one or more accelerometers, one or more gyroscopes, an inertial measurement unit (IMU), a dead-reckoning system, a global navigation satellite system (GNSS), a global positioning system (GPS), a navigation system 147, and/or other suitable sensors. The vehicle sensor(s) 121 can be configured to detect, and/or sense one or more characteristics of the vehicle 100. In one or more arrangements, the vehicle sensor(s) 121 can include a speedometer to determine a current speed of the vehicle 100.

Alternatively, or in addition, the sensor system 120 can include one or more environment sensors 122 configured to acquire, and/or sense driving environment data. "Driving environment data" includes and data or information about the external environment in which an autonomous vehicle is located or one or more portions thereof. For example, the one or more environment sensors 122 can be configured to detect, quantify and/or sense obstacles in at least a portion of the external environment of the vehicle 100 and/or information/data about such obstacles. Such obstacles may be stationary objects and/or dynamic objects. The one or more environment sensors 122 can be configured to detect, measure, quantify and/or sense other things in the external environment of the vehicle 100, such as, for example, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. Moreover, the sensor system 120 can include operator sensors that function to track or otherwise monitor aspects related to the operator of the vehicle 100. However, it will be understood that the embodiments are not limited to the particular sensors described.

As an example, in one or more arrangements, the sensor system 120 can include one or more radar sensors 123, one or more LIDAR sensors 124, one or more sonar sensors 125, one or more cameras 126 and/or inertial measurement units (IMUs) 127. In one or more arrangements, the one or more cameras 126 can be high dynamic range (HDR) cameras, infrared (IR) cameras and so on. In one embodiment, the cameras 126 include one or more cameras disposed within a passenger compartment of the vehicle for performing eye-tracking on the operator in order to determine a gaze of the operator, an eye track of the operator, and so on.

The vehicle 100 can include an input system 130. An "input system" includes any device, component, system, element or arrangement or groups thereof that enable information/data to be entered into a machine. The input system 130 can receive an input from a vehicle passenger (e.g., an operator or a passenger) or from external systems, such as from the platoon apportioning system 170, described above with reference to FIG. 2. The vehicle 100 can include an output system 135. An "output system" includes any device, component, or arrangement or groups thereof that enable information/data to be transmitted to the vehicle or presented to a vehicle passenger (e.g. a person, a vehicle passenger, etc.). The output system 135 can be configured to communicate sensor data and other information to the platoon apportioning system 170, as described above.

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, each or any of the systems or portions thereof may be otherwise combined or segregated via hardware and/or software within the vehicle 100. The vehicle 100 can include a propulsion system 141, a braking system 142, a steering system 143, throttle system 144, a transmission system 145, a signaling system 146, and/or a navigation system 147. Each of these systems can include one or more devices, components, and/or combination thereof, now known or later developed.

The navigation system 147 can include one or more devices, sensors, applications, and/or combinations thereof, now known or later developed, configured to determine the geographic location of the vehicle 100 and/or to determine a travel route for the vehicle 100. The navigation system 147 can include one or more mapping applications to determine a travel route for the vehicle 100. The navigation system 147 can include a global positioning system, a local positioning system or a geolocation system.

The processor(s) 110, the platoon apportioning system 170, and/or the autonomous driving module(s) 160 can be operably connected to communicate with the various vehicle systems 140 and/or individual components thereof. For example, returning to FIG. 1, the processor(s) 110 and/or the autonomous driving module(s) 160 can be in communication to send and/or receive information from the various vehicle systems 140 to control the movement, speed, maneuvering, heading, direction, etc. of the vehicle 100. The processor(s) 110, the platoon apportioning system 170, and/or the autonomous driving module(s) 160 may control some or all of these vehicle systems 140 and, thus, may be partially or fully autonomous.

The processor(s) 110, the platoon apportioning system 170, and/or the autonomous driving module(s) 160 can be operably connected to communicate with the various vehicle systems 140 and/or individual components thereof. For example, returning to FIG. 1, the processor(s) 110, the platoon apportioning system 170, and/or the autonomous driving module(s) 160 can be in communication to send and/or receive information from the various vehicle systems 140 to control the movement, speed, maneuvering, heading, direction, etc. of the vehicle 100. The processor(s) 110, the platoon apportioning system 170, and/or the autonomous driving module(s) 160 may control some or all of these vehicle systems 140.

The processor(s) 110, the platoon apportioning system 170, and/or the autonomous driving module(s) 160 may be operable to control the navigation and/or maneuvering of the vehicle 100 by controlling one or more of the vehicle systems 140 and/or components thereof. For instance, when operating in an autonomous mode, the processor(s) 110, the platoon apportioning system 170, and/or the autonomous driving module(s) 160 can control the direction and/or speed of the vehicle 100. The processor(s) 110, the platoon apportioning system 170, and/or the autonomous driving module(s) 160 can cause the vehicle 100 to accelerate (e.g., by increasing the supply of fuel provided to the engine), decelerate (e.g., by decreasing the supply of fuel to the engine and/or by applying brakes) and/or change direction (e.g., by turning the front two wheels). As used herein, "cause" or "causing" means to make, force, compel, direct, command, instruct, and/or enable an event or action to occur or at least be in a state where such event or action may occur, either in a direct or indirect manner.

The vehicle 100 can include one or more actuators 150. The actuators 150 can be any element or combination of elements operable to modify, adjust and/or alter one or more of the vehicle systems 140 or components thereof to responsive to receiving signals or other inputs from the processor(s) 110 and/or the autonomous driving module(s) 160. Any suitable actuator can be used. For instance, the one or more actuators 150 can include motors, pneumatic actuators, hydraulic pistons, relays, solenoids, and/or piezoelectric actuators, just to name a few possibilities.

The vehicle 100 can include one or more modules, at least some of which are described herein. The modules can be implemented as computer-readable program code that, when executed by a processor 110, implement one or more of the various processes described herein. One or more of the modules can be a component of the processor(s) 110, or one or more of the modules can be executed on and/or distributed among other processing systems to which the processor(s) 110 is operably connected. The modules can include instructions (e.g., program logic) executable by one or more processor(s) 110. Alternatively, or in addition, one or more data store 115 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

The vehicle 100 can include one or more autonomous driving modules 160. The autonomous driving module(s) 160 can be configured to receive data from the sensor system 120 and/or any other type of system capable of capturing information relating to the vehicle 100 and/or the external environment of the vehicle 100. In one or more arrangements, the autonomous driving module(s) 160 can use such data to generate one or more driving scene models. The autonomous driving module(s) 160 can determine position and velocity of the vehicle 100. The autonomous driving module(s) 160 can determine the location of obstacles, or other environmental features including traffic signs, trees, shrubs, neighboring vehicles, pedestrians, etc.

The autonomous driving module(s) 160 can be configured to receive, and/or determine location information for obstacles within the external environment of the vehicle 100 for use by the processor(s) 110, and/or one or more of the modules described herein to estimate position and orientation of the vehicle 100, vehicle position in global coordinates based on signals from a plurality of satellites, or any other data and/or signals that could be used to determine the current state of the vehicle 100 or determine the position of the vehicle 100 with respect to its environment for use in either creating a map or determining the position of the vehicle 100 in respect to map data.

The autonomous driving module(s) 160 either independently or in combination with the platoon apportioning system 170 can be configured to determine travel path(s), current autonomous driving maneuvers for the vehicle 100, future autonomous driving maneuvers and/or modifications to current autonomous driving maneuvers based on data acquired by the sensor system 120, driving scene models, and/or data from any other suitable source. "Driving maneuver" means one or more actions that affect the movement of a vehicle. Examples of driving maneuvers include: accelerating, decelerating, braking, turning, moving in a lateral direction of the vehicle 100, changing travel lanes, merging into a travel lane, and/or reversing, just to name a few possibilities. The autonomous driving module(s) 160 can be configured can be configured to implement determined driving maneuvers. The autonomous driving module(s) 160 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 160 can be configured to execute various vehicle functions and/or to transmit data to, receive data from, interact with, and/or control the vehicle 100 or one or more systems thereof (e.g. one or more of vehicle systems 140). The noted functions and methods will become more apparent with a further discussion of the figures.

The vehicle 100 can further include an augmented reality (AR) system 180. It should be appreciated that the AR system 180 can take many different forms but in general functions to augment or otherwise supplement viewing of objects within a real-world environment surrounding the vehicle. That is, for example, the AR system 180 can overlay graphics using one or more AR displays in order to provide for an appearance that the graphics are integrated with the real-world through, for example, the windshield of the vehicle 100. Thus, the AR system 180 can include displays integrated with the windshield, side windows, rear windows, mirrors and other aspects of the vehicle 100. In further aspects, the AR system 180 can include head-mounted displays such as goggles or glasses. In either case, the AR system 180 functions to render graphical elements that are in addition to objects in the real-world, modifications of objects in the real-world, and/or a combination of the two. In one embodiment, at least one AR display of the AR system 180 fuses a real-time image from a camera (e.g., exterior facing camera) of at least part of the surroundings of the vehicle 100 with synthetic objects (e.g., rendered graphical elements) from the AR system 180 and/or the platoon apportioning system 170. As one example, a monitor (i.e., AR display) is integrated within or just above a dashboard of the vehicle 100 and is controlled to display a fused view of graphical elements rendered by the AR system 180 with real-world images from the camera. In this way, the AR system 180 can augment or otherwise modify a view of an operator/passenger in order to provide an enriched/embellished visual sensory experience.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6, but the embodiments are not limited to the illustrated structure or application.

The flowcharts and block diagrams in the figures illustrate the architecture, functionality, and operation of possible embodiments of systems, methods and computer program products according to various embodiments. In this regard, each block in the flowcharts or block diagrams can represent a module, segment, or portion of code, which comprises one or more executable instructions for implementing the specified logical function(s). It should also be noted that, in some alternative embodiments, the functions noted in the block can occur out of the order noted in the Figures. For example, two blocks shown in succession can, in fact, be executed substantially concurrently, or the blocks can sometimes be executed in the reverse order, depending upon the functionality involved.

The systems, components and/or methods described above can be realized in hardware or a combination of hardware and software and can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with computer-usable program code that, when being loaded and executed, controls the processing system such that it carries out the methods described herein. The systems, components and/or methods also can be embedded in a computer-readable storage, such as a computer program product or other data programs storage device, readable by a machine, tangibly embodying a program of instructions executable by the machine to perform methods and methods described herein. These elements also can be embedded in an application product which comprises all the features enabling the embodiment of the methods described herein and, which when loaded in a processing system, is able to carry out these methods.

Furthermore, arrangements described herein can take the form of a computer program product embodied in one or more computer-readable media having computer-readable program code embodied or embedded, such as stored thereon. Any combination of one or more computer-readable media can be utilized. The computer-readable medium can be a computer-readable signal medium or a computer-readable storage medium. The phrase "computer-readable storage medium" means a non-transitory storage medium. A computer-readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk drive (HDD), a solid state drive (SSD), a random access memory (RAM), a read-only memory (ROM), an erasable programmable read-only memory (EPROM or Flash memory), an optical fiber, a portable compact disc read-only memory (CD-ROM), a digital versatile disc (DVD), an optical storage device, a magnetic storage device, or any suitable combination of the foregoing. In the context of this document, a computer-readable storage medium can be any tangible medium that can contain, or store a program for use by or in connection with an instruction execution system, apparatus, or device.

Program code embodied on a computer-readable medium can be transmitted using any appropriate medium, including but not limited to wireless, wireline, optical fiber, cable, RF, etc., or any suitable combination of the foregoing. Computer program code for carrying out operations for aspects of the present arrangements can be written in any combination of one or more programming languages, including an object-oriented programming language such as Java™, Smalltalk, C++ or the like and conventional procedural programming languages, such as the "C" programming language or similar programming languages. The program code can execute entirely on the user's computer, partly on the user's computer, as a stand-alone software package, partly on the user's computer and partly on a remote computer, or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g., AB, AC, BC or ABC).

While the foregoing is directed to embodiments of the disclosed devices, systems, and methods, other and further embodiments of the disclosed devices, systems, and methods can be devised without departing from the basic scope thereof. The scope thereof is determined by the claims that follow.

What is claimed is:

1. A platoon apportioning system for vehicle positioning and benefit distribution in a vehicle platoon, comprising:
   one or more processors; and
   a memory communicably coupled to the one or more processors and storing:
      a benefit determination module including instructions that when executed by the one or more processors cause the one or more processors to perform one or more vehicle simulations and to determine, using the one or more vehicle simulations, one or more cumulative travel benefits for a group of vehicles, the one or more vehicle simulations determining expectations of vehicle wear, fuel usage, maximum driving speed, and load capacity;
      a platoon formation module including instructions that when executed by the one or more processors cause the one or more processors to define a platoon organization to achieve at least a portion of the one or more cumulative travel benefits; and
      an apportioning module including instructions that when executed by the one or more processors cause the one or more processors to determine a benefit distribution of the cumulative travel benefits for the platoon organization, and to apportion the cumulative travel benefits to the group of vehicles based on the benefit distribution.

2. The platoon apportioning system of claim 1, wherein the platoon formation module further comprises instructions to perform one or more platoon simulations, wherein the one or more platoon simulations are used in determining the platoon organization.

3. The platoon apportioning system of claim 2, wherein the benefit distribution is estimated based on the one or more platoon simulations.

4. The platoon apportioning system of claim 1, wherein the one or more cumulative travel benefits includes selected travel benefits.

5. The platoon apportioning system of claim 4, wherein the selected travel benefits are determined using vehicle-specific efficiency information.

6. The platoon apportioning system of claim 1, wherein apportioning the cumulative travel benefits includes transferring compensation from a first vehicle to a second vehicle.

7. A non-transitory computer-readable medium for vehicle positioning and benefit distribution in a vehicle platoon and storing instructions that when executed by one or more processors cause the one or more processors to:
   perform one or more vehicle simulations;
   determine one, using the one or more vehicle simulations, or more cumulative travel benefits for a group of vehicles, the one or more vehicle simulations determining expectations of vehicle wear, fuel usage, maximum driving speed, and load capacity;
   define a platoon organization to achieve at least a portion of the one or more cumulative travel benefits;
   determine a benefit distribution of the cumulative travel benefits for the platoon organization; and
   apportion the cumulative travel benefits to the group of vehicles based on the benefit distribution.

8. The non-transitory computer-readable medium of claim 7, further comprising instructions to perform one or more platoon simulations, wherein the one or more platoon simulations are used in determining the platoon organization.

9. The non-transitory computer-readable medium of claim 8, wherein the benefit distribution is estimated based on the one or more platoon simulations.

10. The non-transitory computer-readable medium of claim 7, wherein the one or more cumulative travel benefits includes selected travel benefits.

11. The non-transitory computer-readable medium of claim 10, wherein the selected travel benefits are determined using vehicle-specific efficiency information.

12. The non-transitory computer-readable medium of claim 7, wherein apportioning the cumulative travel benefits includes transferring compensation from a first vehicle to a second vehicle.

13. A method for vehicle positioning and benefit distribution in a vehicle platoon, comprising:
   performing one or more vehicle simulations;
   determining, using the one or more vehicle simulations, one or more cumulative travel benefits for a group of vehicles, the one or more vehicle simulations determining expectations of vehicle wear, fuel usage, maximum driving speed, and load capacity;
   defining a platoon organization to achieve at least a portion of the one or more cumulative travel benefits;
   determining a benefit distribution of the cumulative travel benefits for the platoon organization; and
   apportioning the cumulative travel benefits to the group of vehicles based on the benefit distribution.

14. The method of claim 13, further comprising performing one or more platoon simulations, wherein the one or more platoon simulations are used in determining the platoon organization.

15. The method of claim 14, wherein the benefit distribution is estimated based on the one or more platoon simulations.

16. The method of claim 13, wherein the one or more cumulative travel benefits includes selected travel benefits.

17. The method of claim 16, wherein the selected travel benefits are determined using vehicle-specific efficiency information.

* * * * *